US011112451B2

(12) United States Patent
Lee et al.

(10) Patent No.: US 11,112,451 B2
(45) Date of Patent: Sep. 7, 2021

(54) TEST METHOD FOR SEMICONDUCTOR DEVICES AND A TEST SYSTEM FOR SEMICONDUCTOR DEVICES

(71) Applicant: SAMSUNG ELECTRONICS CO., LTD., Suwon-si (KR)

(72) Inventors: Chul-Min Lee, Asan-si (KR);
Tae-Kyung Ko, Cheonan-si (KR);
Jin-Seong Kim, Asan-si (KR);
Hyeong-Gon Son, Asan-si (KR);
Seung-Woo Hong, Cheonan-si (KR);
Dong-Gu Lee, Cheonan-si (KR);
Sang-Jae Rhee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 287 days.

(21) Appl. No.: 16/296,954

(22) Filed: Mar. 8, 2019

(65) Prior Publication Data
US 2020/0025821 A1    Jan. 23, 2020

(30) Foreign Application Priority Data
Jul. 17, 2018    (KR) .................. 10-2018-0082781

(51) Int. Cl.
*G01R 31/28*    (2006.01)
*G01R 31/317*    (2006.01)
(52) U.S. Cl.
CPC ... *G01R 31/2867* (2013.01); *G01R 31/31718* (2013.01)

(58) Field of Classification Search
CPC .............. G01R 31/31924; G01R 31/26; G01R 31/2642; G01R 31/2648; G01R 31/2831; G01R 31/31702
See application file for complete search history.

(56) References Cited

U.S. PATENT DOCUMENTS

| | | | |
|---|---|---|---|
| 5,856,923 | A | 1/1999 | Jones et al. |
| 6,830,941 | B1 | 12/2004 | Lee et al. |
| 7,230,417 | B2 | 6/2007 | Chung et al. |
| 7,343,214 | B2 | 3/2008 | Koh |
| 7,408,339 | B2 | 8/2008 | Chung et al. |
| 7,656,150 | B2 | 2/2010 | Shim et al. |
| 8,013,620 | B2 | 9/2011 | Shim et al. |
| 9,000,789 | B2 | 4/2015 | Kim et al. |

(Continued)

FOREIGN PATENT DOCUMENTS

| | | |
|---|---|---|
| JP | 11-121566 | 4/1999 |
| JP | 2002-170859 | 6/2002 |

(Continued)

*Primary Examiner* — Tung X Nguyen
(74) *Attorney, Agent, or Firm* — F. Chau & Associates, LLC

(57) ABSTRACT

A test method for a semiconductor device includes: loading a test tray having semiconductor devices of first and second lots arranged thereon into a test chamber; storing lot information of each of the semiconductor devices; performing a test program on each of the semiconductor devices; obtaining ID information of each of the semiconductor devices; matching the ID information with the lot information to generate lot sorting information; and sorting the semiconductor devices based on results of the test program and the lot sorting information.

19 Claims, 7 Drawing Sheets

(56) References Cited

U.S. PATENT DOCUMENTS

| | | | |
|---|---|---|---|
| 2004/0107395 A1* | 6/2004 | Volkerink | G01R 31/31705 |
| | | | 714/732 |
| 2007/0075719 A1* | 4/2007 | Chung | G01R 31/2893 |
| | | | 324/750.15 |
| 2008/0186047 A1 | 8/2008 | Beom et al. | |
| 2009/0261817 A1 | 10/2009 | Beom et al. | |
| 2015/0198658 A1 | 7/2015 | Kim et al. | |

FOREIGN PATENT DOCUMENTS

| | | |
|---|---|---|
| KR | 10-2006-0100852 | 9/2006 |
| KR | 10-0640590 | 11/2006 |
| KR | 10-2007-0012967 | 1/2007 |
| KR | 10-0761310 | 9/2007 |
| KR | 10-0800312 | 2/2008 |
| KR | 10-0857911 | 9/2008 |
| KR | 10-0938466 | 1/2010 |
| KR | 10-1007933 | 1/2011 |
| KR | 10-1327455 | 11/2013 |
| KR | 10-1734364 | 5/2017 |

\* cited by examiner

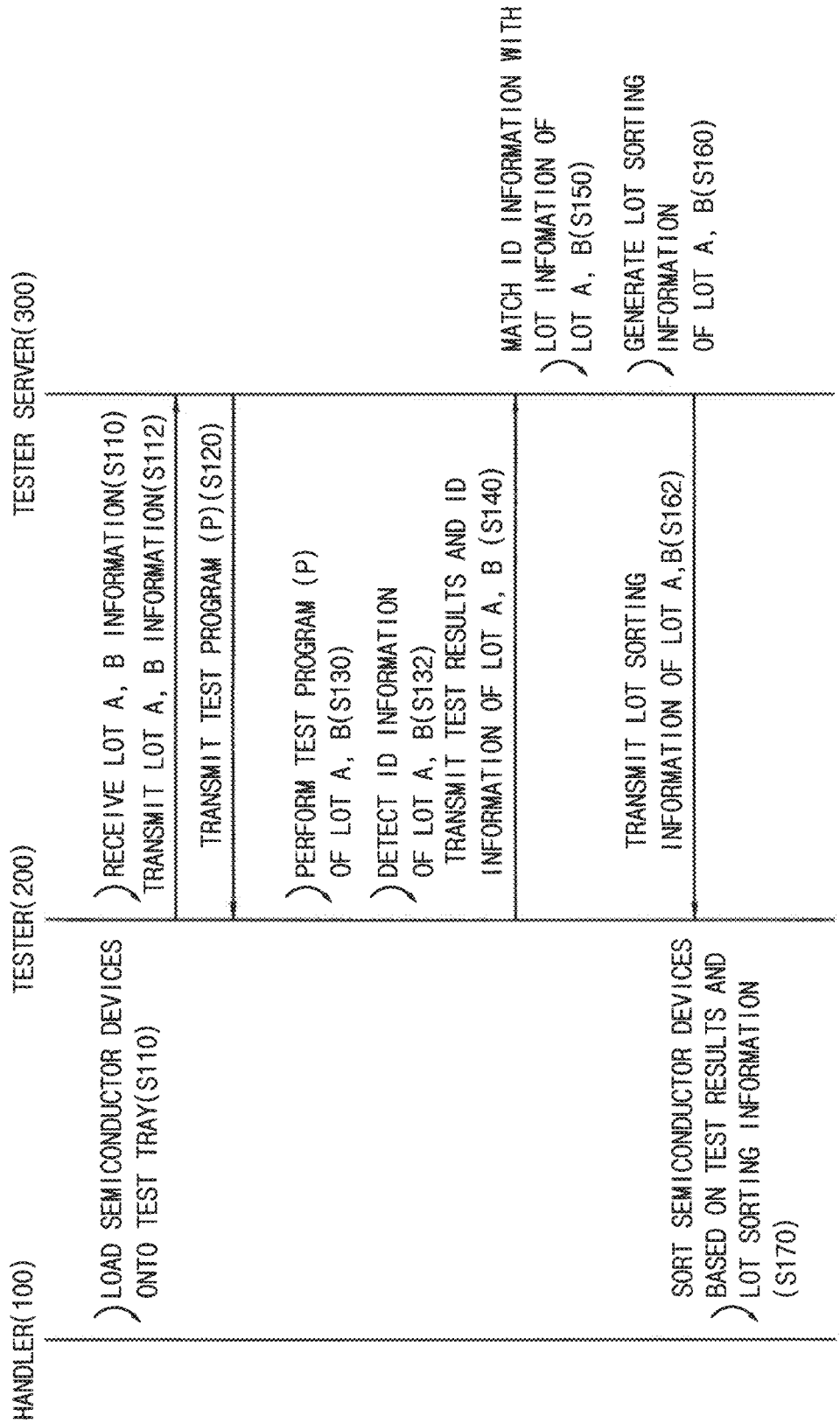

TEST METHOD FOR SEMICONDUCTOR DEVICES AND A TEST SYSTEM FOR SEMICONDUCTOR DEVICES

CROSS REFERENCE TO RELATED APPLICATION

This application claims priority under 35 U.S.C. § 119 to Korean Patent Application No. 10-2018-0082781, filed on Jul. 17, 2018 in the Korean Intellectual Property Office (KIPO), the disclosure of which is incorporated by reference herein in its entirety.

TECHNICAL FIELD

Exemplary embodiments of the inventive concept relate to a test method for semiconductor devices and a test system for semiconductor devices. More particularly, exemplary embodiments of the inventive concept relate to a method of testing semiconductor devices using a tester handler and a test system for semiconductor devices for performing the method.

DESCRIPTION OF THE RELATED ART

A semiconductor device test process or a test process of a semiconductor device may be a process of electrically testing a function of a completely manufactured semiconductor device in a wafer state or a package state. A test system for the test process of the semiconductor device may include a tester and a tester handler. In such a test system, even when semiconductor devices of different lots are to be tested with the same test program, the semiconductor devices of the different lots cannot be tested together. This is so, because the test of the semiconductor devices of a next lot must wait until the test of the semiconductor devices of a current lot is completed.

SUMMARY

A test method for a semiconductor device according to an exemplary embodiment of the inventive concept includes: loading a test tray having semiconductor devices of first and second lots arranged thereon into a test chamber; storing lot information of each of the semiconductor devices; performing a test program on each of the semiconductor devices; obtaining ID information of each of the semiconductor devices; matching the ID information with the lot information to generate lot sorting information; and sorting the semiconductor devices based on results of the test program and the lot sorting information.

A test method for a semiconductor device according to an exemplary embodiment of the inventive concept includes: sequentially loading a test tray having semiconductor devices of first and second lots arranged thereon into first and second tester handlers which perform different test programs; storing lot information of each of the semiconductor devices when the semiconductor devices are loaded into the first and second tester handlers; sequentially performing the test programs on the semiconductor devices in the first tester handler, and then, sequentially performing the test programs on the semiconductor devices in the second tester handler; matching the ID information with the lot information of each of the semiconductor devices when each of the test programs is performed, to generate lot sorting information; and after performing a final test program, sorting the semiconductor devices based on test results and the lot sorting information.

A test system for a semiconductor device according to an exemplary embodiment of the inventive concept includes: a tester configured to test semiconductor devices; a tester server connected to the tester, and configured to provide a test program to the tester and configured to match ID information with lot information of each of the semiconductor devices to generate lot sorting information when the test program is performed; and a tester handler connected to the tester, and configured to load and unload the semiconductor devices into and from a test chamber to electrically test the semiconductor devices and configured to sort the semiconductor devices based on test results and the lot sorting information.

According to exemplary embodiments of the inventive concept, in a method of testing memory devices, memory devices are inserted into a plurality of test sockets arranged in a first direction within a test chamber. A test program of the memory devices is performed. Temperature information of the memory devices is detected from temperature sensors of the memory devices. A temperature of the test chamber is adjusted to compensate for a temperature difference between the detected temperature of the memory devices and a target temperature.

BRIEF DESCRIPTION OF THE DRAWINGS

Exemplary embodiments of the inventive concept will be more clearly understood from the following detailed description taken in conjunction with the accompanying drawings.

FIG. 3 is a flow chart illustrating a test method for a semiconductor device in accordance with exemplary embodiments of the inventive concept.

DETAILED DESCRIPTION OF THE EMBODIMENTS

Hereinafter, exemplary embodiments of the inventive concept will be explained in detail with reference to the accompanying drawings.

Figure 1:
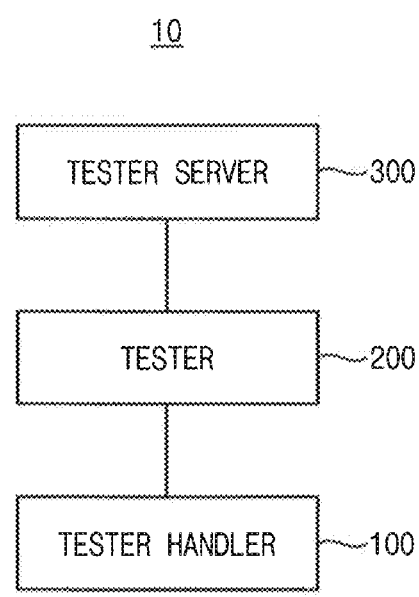
FIG. 1 is a block diagram illustrating a test system for a semiconductor device in accordance with exemplary embodiments of the inventive concept.
Figure 2:
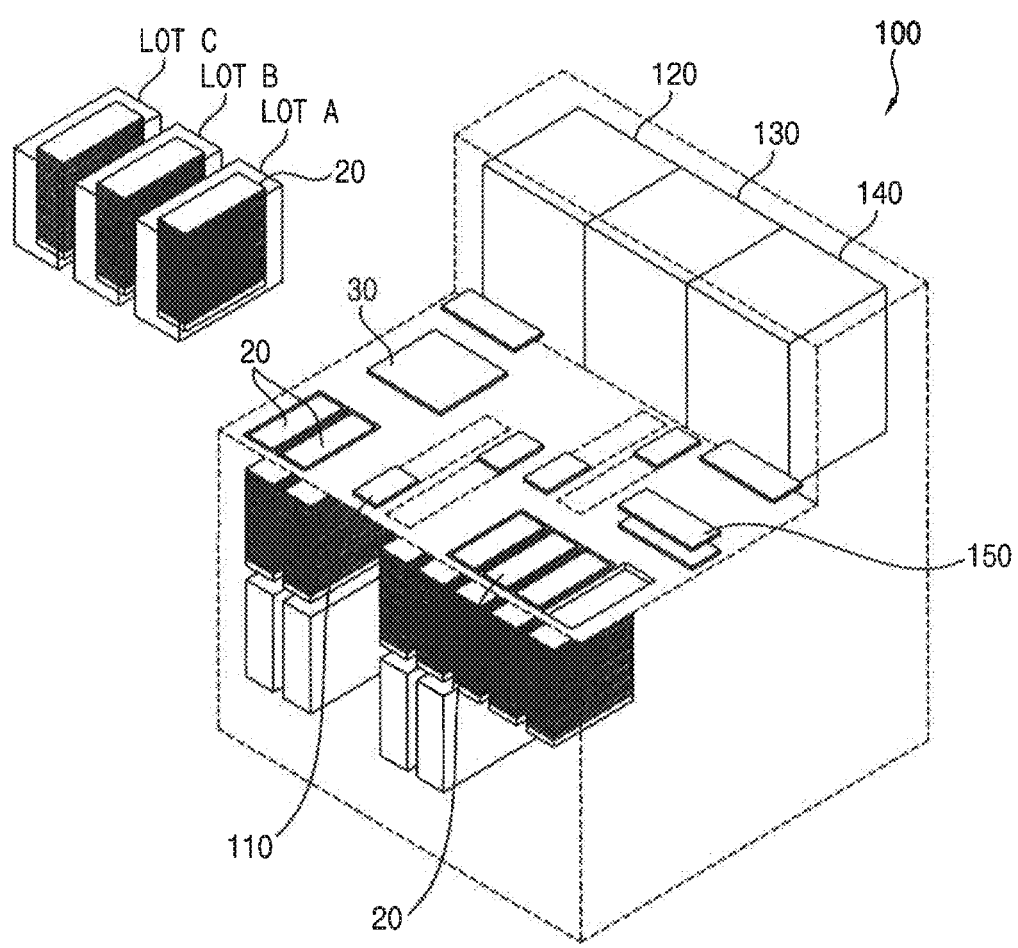
FIG. 2 is a perspective view illustrating a tester handler of the test system in FIG. 1.

FIG. 1 is a block diagram illustrating a test system for a semiconductor device in accordance with exemplary embodiments of the inventive concept. FIG. 2 is a perspective view illustrating a tester handler of the test system in FIG. 1.

Referring to FIGS. 1 and 2, a test system for a semiconductor device 10 may include a tester 200, a tester handler 100 and a tester server 300. The tester 200 is used to test a semiconductor device. The tester handler 100 may be connected to the tester 200 and configured to load the semiconductor device into a test chamber and unload the semiconductor device from the test chamber. The tester server 300 may be connected to the tester 200 and configured to provide a test program to the tester 200 and collect test results from the tester 200.

In exemplary embodiments of the inventive concept, the tester handler 100 may include a loading part, a soak chamber 120, a test chamber 130, a de-soak chamber 140 and an unloading part. The tester handler 100 may be automated robotic equipment for providing an external condition, such as temperature, to electrically test the semiconductor device, for automatically moving the semiconductor device under test, and for sorting the semiconductor device according to a result of the test.

The loading part may include a plurality of loading stackers and a loading hand 110. A loading stacker may store a plurality of customer trays 20 which receive semiconductor devices to be tested. The loading hand 110 may move and stack the semiconductor devices from the customer tray 20 to a test tray 30.

The soak chamber 120 may pre-heat or pre-cool the semiconductor devices on the test tray 30. Test trays 30, which have the semiconductor devices arranged thereon, may be sequentially loaded to the soak chamber 120 by the loading hand 110. The test trays 30 loaded into the soak chamber 120 may be moved toward the test chamber 130 while being maintained to a vertical state. While the test trays 30 are moved toward the test chamber 130 and are still within the soak chamber 120, the semiconductor devices on the test trays 30 may be pre-heated or pre-cooled.

The test chamber 130 may provide a temperature condition for testing a semiconductor device. The test tray 30 having the semiconductor devices arranged thereon may be moved to the test chamber 130, and then, a test program may be performed on the semiconductor devices. The semiconductor devices on the test tray 30 may be electrically connected to a socket of a test board within the test chamber 130 to perform an electrical test.

The de-soak chamber 140 may bring the semiconductor device of the high temperature or the low temperature to a room temperature. The test tray 30 holding the tested semiconductor devices may be moved into the de-soak chamber 140.

The unloading part may sort the semiconductor devices on the test tray 30 provided from the de-soak chamber 140 according to sorting information. The sorting information may include test grade sorting information and lot sorting information. The unloading part may include a plurality of unloading stackers and a sorting hand 150. An unloading stacker may store a plurality of the customer trays 20 which receive semiconductor devices sorted according to the test results. For example, the unloading hand 150 may sort the semiconductor devices on the test tray 30 according to the test results, and then, move and stack the sorted semiconductor devices to one of the customer trays 20.

In exemplary embodiments of the inventive concept, semiconductor devices of different lots may be loaded together into the tester handler 100 to be tested. For example, semiconductor devices of lot A, lot B and lot C may be sequentially loaded together into the tester handler 100, and then, a same test program may be performed on the semiconductor devices of the lots A-C.

Here, a lot may be a manufacturing batch number which identifies a specific batch or a manufacturing unit. The semiconductor devices of the lot A may be semiconductor devices packaged under a first manufacturing condition. The semiconductor devices of the lot B may be semiconductor devices packaged under a second manufacturing condition, and the semiconductor devices of the lot C may be semiconductor devices packaged under a third manufacturing condition. For example, a semiconductor device may include a semiconductor package having semiconductor chips therein. The semiconductor chip may include a memory device such as dynamic random access memory (DRAM), VNAND, etc.

The tester 200 may receive a test program for a semiconductor device from the tester server 300 to perform the test program. The tester 200 may transmit the test results of the semiconductor device to the tester server 300.

The tester 200 may be connected to the tester handler 100 to communicate data therewith. The data may be communication data for the electrical test of the semiconductor device. For example, the data may include a test start signal and a test end signal for the semiconductor device, a category bin depending on the test results, etc.

The tester 200 may receive lot information of the semiconductor device loaded into the tester handler 100. For example, an operator may input the number of lots, in other words, a lot number of the semiconductor device to be tested by using a control console of the tester 200. The tester 200 may transmit the received lot information (e.g., the lot number) to the tester server 300, and the tester server 300 may transmit a test program corresponding to the lot number of the semiconductor device to be tested to the tester 200. Hereinafter, a semiconductor device to be tested may be referred to as a test-target semiconductor device.

Additionally, the tester 200 may detect ID information of the semiconductor device while the test program is performed, and may transmit the detected ID information together with the test results to the tester server 300. Each of the semiconductor devices may have a unique ID for identification. The ID information may be a programmed fuse ID that is electrically searchable. While performing the test program, the tester 200 may read the ID information of the semiconductor device and transmit the ID information to the tester server 300.

The tester server 300, which receives the lot information and the ID information, stores the lot information and the ID information in a database. The tester server 300 may match the ID information with the lot information to map the semiconductor device having the unique ID to the respective lot number. For example, semiconductor device 1 may be mapped to lot number 1. The test results of the semiconductor device having the unique ID may be stored together with the respective lot number in the tester server 300. For example, test results of semiconductor device 1 are stored with lot number 1. The tester server 300 may store the test results and the lot information as historical test data of the semiconductor device. For example, the test results of semiconductor device 1 and lot number 1 are stored as historical data of semiconductor device 1. Accordingly, the historical test data of the semiconductor device having the unique ID may include the test result information and the lot information.

The tester server 300 may generate sorting information for sorting the semiconductor device based on the test results and the respective lot number. In other words, the tester server 300 may generate the sorting information based on the historical test data of the semiconductor device. Here, the sorting information may include test grade sorting information and lot sorting information. The tester server 300 may transmit the sorting information to the tester 200, and accordingly, the tester handler 100 may sort the semiconductor device according to the test grade result and the lot number and subsequently move and stack the semiconductor device to a particular one of the customer trays 20.

Hereinafter, a method of testing a semiconductor device using the test system in FIG. 1 will be explained.

Figure 4A:
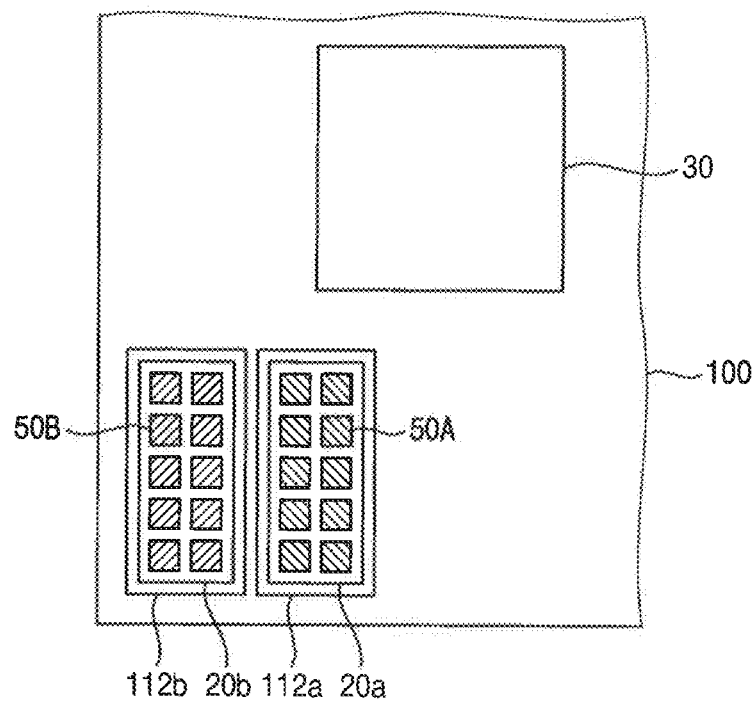
FIGS. 4A, 4B and 4C are views illustrating semiconductor devices on a customer tray and a test tray within a tester handler when performing the test method in FIG. 3.
Figure 4B:
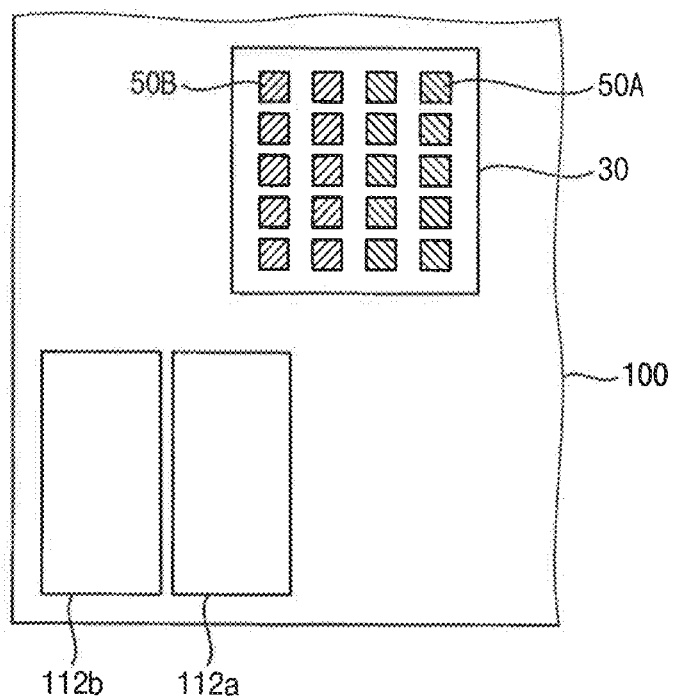
Figure 4C:
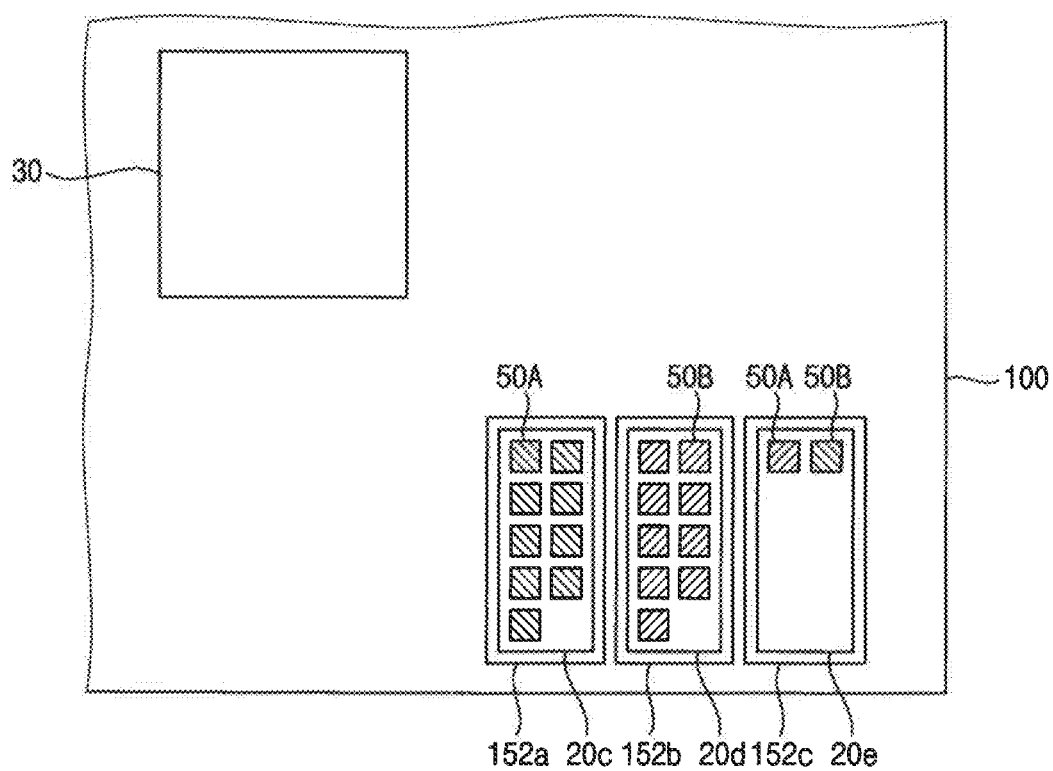

FIG. 3 is a flow chart illustrating a test method for a semiconductor device in accordance with exemplary embodiments of the inventive concept. FIGS. 4A to 4C are views illustrating semiconductor devices on a customer tray and a test tray within a tester handler when performing the test method in FIG. 3.

Referring to FIG. 1 to 4C, semiconductor devices of different lots (e.g., lot A, lot B, lot C) may be loaded on a test tray 30 of a tester handler 100 (S100). Here, the same test program may be performed on the semiconductor devices of the different lots (e.g., lot A, lot B, lot C).

For example, each of the lot A, the lot B and lot C may receive 21 to 42 customer trays 20. The number of the semiconductor devices stacked on one customer tray 20 may be 72 to 176, and the number of the semiconductor devices stacked on one test tray 30 may be 64, 128, or 256. The number of the semiconductor devices stacked on one test tray 30 may be greater than the number of the semiconductor devices stacked on one customer tray 20. It is to be understood that the number of the customer trays 20 received in each of the lots A-C, the numbers of the semiconductor devices stacked on the test tray 30 and the customer tray 20, are not limited thereto.

The semiconductor devices on one or two test trays 30 may be tested once within the test chamber 130 of the tester handler 100.

For example, when the lot A includes 800 semiconductor devices, if 256 semiconductor devices of the lot A are tested once within the test chamber 130, by the fourth test, only 32 semiconductor devices may be stacked on the test tray 30 to be tested. Since only 32 semiconductor devices are stacked on the test tray for the fourth test, there is space for an additional 224 semiconductor devices. Thus, since the same test program is to be performed on the semiconductor devices of the lot A and the lot B, 224 of the semiconductor devices of the lot B may be stacked on empty mounting portions of the test tray 30, moved to the test chamber 130, and then, the same test program may be performed on the semiconductor 32 devices of the lot A and the 224 devices of the lot B.

As illustrated in FIG. 4A, a first customer tray 20*a* having semiconductor devices 50A of the lot A stacked thereon may be moved to a first loading stacker 112*a* of the loading part, and a second customer tray 20*b* having semiconductor devices 50B of the lot B stacked thereon may be moved to a second loading stacker 112*b* of the loading part.

Then, as illustrated in FIG. 4B, the loading hand 110 may move and stack the semiconductor devices 50A on the first customer tray 20*a* to some mounting portions of the test tray 30 and the semiconductor devices 50B on the second customer tray 20*b* to other mounting portions of the test tray 30.

Then, the test tray 30 having the semiconductor devices 50A of the lot A and the semiconductor devices 50B of the lot B stacked thereon may be moved to the test chamber 130, and then, the same test program may be performed on the semiconductor devices 50A of the lot A and the semiconductor devices 50B of the lot B.

In exemplary embodiments of the inventive concept, when the semiconductor devices are moved to the loading part of the tester handler 100, an operator may input the lot information of the semiconductor devices by using the control console of the tester 200 or the lot information may be obtained by reading an electric signal from the customer tray (S110). In other words, the information of the lot A and the lot B may be received by the tester 200.

As illustrated in FIGS. 4A and 4B, when the semiconductor devices 50A of the lot A and the semiconductor devices 50B of the lot B are loaded onto one test tray 30, the tester 200 may receive the lot information of the loaded semiconductor devices 50A, 50B, for example, the lot numbers (lot A, lot B). When the semiconductor devices 50A, 50B are loaded into the loading part of the tester handler 100, the tester handler 100 may read a radio frequency identification (RFID) tag on the customer tray 20 to obtain the lot information and input the lot information to the tester 200.

The tester 200 may transmit the lot information to the tester server 300 (S112). Additionally, the tester 200 may transmit and receive a mapping signal between the lot information (lot A, lot B) and the semiconductor devices 50A, 50B.

Then, the tester server 300 may transmit a test program (P) to the tester 200 (S120), and the tester 200 may perform the test program (P) on the semiconductor devices 50A, 50B of the lot A and the lot B together (S130). Here, the tester 200 may detect ID information of the semiconductor devices 50A, 50B when performing the test program (P) (S132).

The test program (P) which is transmitted from the tester server 300 and is to be performed on the semiconductor devices 50A, 50B, corresponds to the lot information provided from the tester 200. The tester 200 may be connected to the tester handler 100 to communicate data with the tester handler 100 for an electrical test.

Additionally, the tester 200 may detect ID information of the semiconductor devices 50A, 50B while the test program (P) is performed. Each of the semiconductor devices 50A, 50B may have a unique ID for identification. The ID information may be a programmed fuse ID to be electrically searchable.

Then, when the test program (P) is completed, the tester 200 may transmit test results and the ID information of the semiconductor devices 50A, 50B of the lot A and the lot B to the tester server 300 (S140).

Then, the tester server 300 may match the ID information with the lot information of the semiconductor devices 50A, 50B of the lot A and the lot B (S150), and may generate sorting information for sorting the semiconductor devices 50A, 50B based on the test results and the lot information (S160).

The tester server 300 may receive and store the lot information and the ID information of the semiconductor devices 50A, 50B in a database. The tester server 300 may match the ID information with the lot information for each of the semiconductor devices 50A, 50B. In addition, the tester server 300 may store the test results and the lot information of the semiconductor device 50A as historical test data for the semiconductor device 50A, and store the test results and the lot information of the semiconductor device 50B as historical test data for the semiconductor device 50B. Accordingly, the historical test data of a particular semiconductor device having a unique ID may include its test result information and its lot information.

The tested semiconductor devices 50A, 50B may be mapped to respective lot numbers (lot A, lot B). Accordingly, the test results of a particular semiconductor device having a unique ID may be stored together with its lot number in the tester server 300.

The tester server 300 may generate the sorting information for sorting the semiconductor devices based on their test results and lot numbers. In other words, the tester server 300 may generate the sorting information based on the historical test data of each of the semiconductor devices 50A, 50B. The sorting information may include test grade sorting information and lot sorting information.

Then, the tester server 300 may transmit the sorting information of each of the semiconductor devices 50A, 50B of the lot A and the lot B to the tester 200 (S162), and accordingly, the tester handler 100 may sort the semiconductor devices 50A, 50B according to the test grade result and the lot sorting information (S170).

The tester handler 100 may sort the tested semiconductor devices 50A, 50B on the test tray 30 provided from the test chamber 130 according to the test grade result and the lot sorting information and move and stack the semiconductor devices to the customer trays 20.

As illustrated in FIG. 4C, the semiconductor devices 50A which are determined to be non-defective according to the test results (test grade information) and have the matched lot number of the lot A (lot sorting information) may be moved and stacked on a third customer tray 20c of a first unloading stacker 152a of the unloading part. The semiconductor devices 50B which are determined to be non-defective according to the test results (test grade information) and have the matched lot number of the lot B (lot sorting information) may be moved and stacked on a fourth customer tray 20d of a second unloading stacker 152b of the unloading part. In addition, the semiconductor devices 50A, 50B which are determined to be defective according to the test results (test grade information) and have the matched lot number of the lot A or the lot B (lot sorting information) may be moved and stacked on a fifth customer tray 20e of a third unloading stacker 152c of the unloading part.

Alternatively, a first test program may be performed on semiconductor devices of different lots (lot A, lot B), and then, a second test program may be performed on semiconductor devices of another lot (lot C).

In the case that the first test program is performed on the semiconductor devices of the lot A and the lot B and the second test program is performed on the semiconductor devices of the lot C, the semiconductor devices of the lot C may not be loaded and be ready until the first test program is completed. In other words, the semiconductor devices of the lot C may not be tested together with the semiconductor devices of the lot A or the lot B. Instead, the semiconductor devices of the lot C may be tested alone after the test for semiconductor devices of the lot A or the lot B is completed.

As mentioned above, in the ease that the same test program is performed on different lots, e.g., a preceding lot (lot A) and a following lot (lot B), instead of making the semiconductor devices of the following lot B wait until the test of the semiconductor devices of the preceding lot A is completed, the semiconductor devices 50A, 50B of the preceding lot A and the following lot B may be loaded on one test tray 30 and tested together. When the semiconductor devices 50A, 50B are loaded, the lot information (lot A, lot B) of each of the semiconductor devices 50A, 50B may be stored, and when the test programs are performed, the ID information and the lot information of each of the semiconductor devices 50A, 50B may be matched to generate the lot sorting information. After performing the test, the semiconductor devices 50A, 50B may be sorted according to the test results and the lot sorting information.

After the test is completed, the semiconductor devices 50A, 50B may be sorted on respective lots according to the test results and may be managed as such. Thus, a loading time and an unloading time required for replacement of lot may be reduced to thereby increase productivity.

Figure 5:
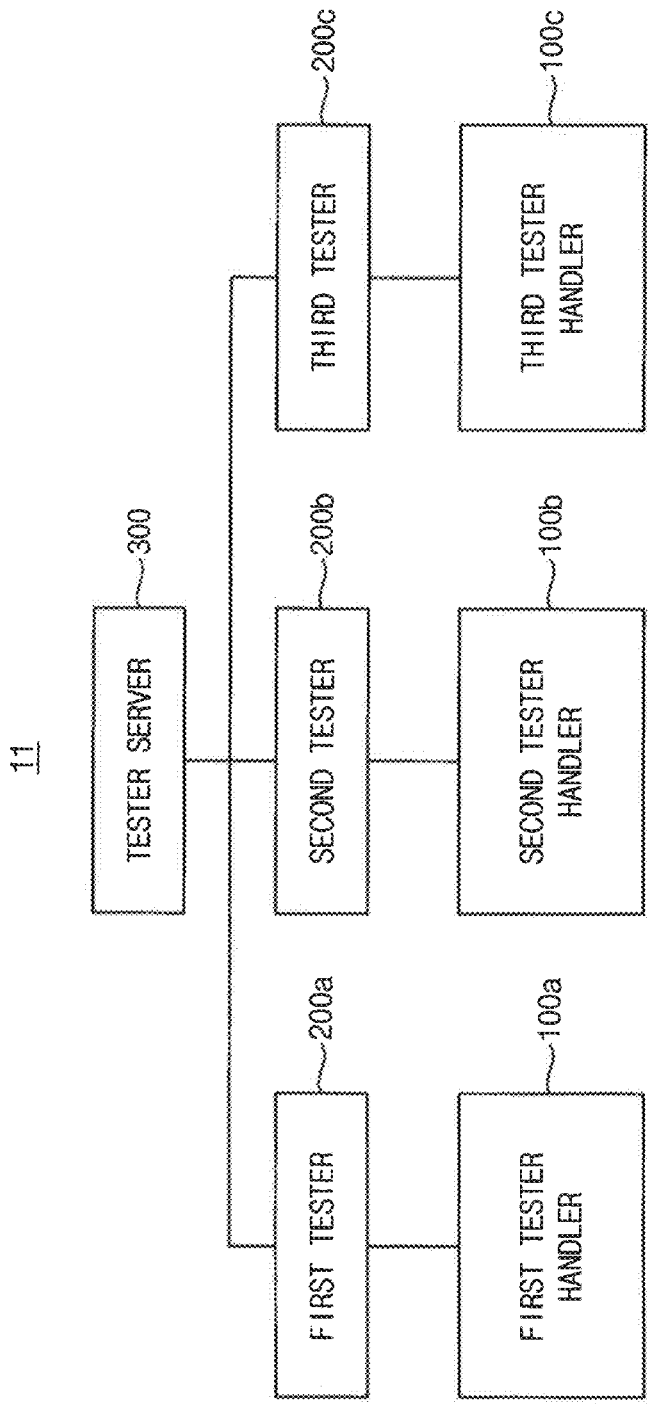
FIG. 5 is a block diagram illustrating a test system for a semiconductor device in accordance with exemplary embodiments of the inventive concept.

FIG. 5 is a block diagram illustrating a test system for a semiconductor device in accordance with exemplary embodiments of the inventive concept. The test system may be substantially the same as the test system described with reference to FIGS. 1 and 2 except for the configuration of an additional tester and a tester handler. Thus, the same reference numerals may be used to refer to the same or like elements and any further repetitive explanation concerning the above elements may be omitted.

Referring to FIG. 5, a test system for a semiconductor device 11 may include first, second and third testers 200a, 200b, 200c to test a semiconductor device, first, second and third tester handlers 100a, 100b, 100c respectively connected to the first, second and third testers 200a, 200b, 200c and configured to load and unload the semiconductor device into and from a test chamber to electrically test the semiconductor device, and a tester server 300 connected to the first, second and third testers 200a, 200b, 200c and configured to provide a test program to the first, second and third testers 200a, 200b, 200c and collect test results from the first, second and third testers 200a, 200b, 200c.

In exemplary embodiments of the inventive concept, a first test program (P1) may be performed in the first tester handler 100a, a second test program (P2) may be performed in the second tester handler 100b, and a third test program (P3) may be performed in the third tester handler 100c.

Semiconductor devices may be loaded and unloaded sequentially to and from the first, second and third tester handlers 100a, 100b, 100c and then the first, second and third test programs (P1, P2, P3) may be performed. The first, second and third test programs (P1, P2, P3) may be different from each other. For example, the first, second and third test programs (P1, P2, P3) may include a high frequency-hot (HFH) test program, a high frequency-cool (HFC) test program, a low frequency-hot (LFH) test program, a low frequency-cool (LFC) test program, etc.

Figure 6:
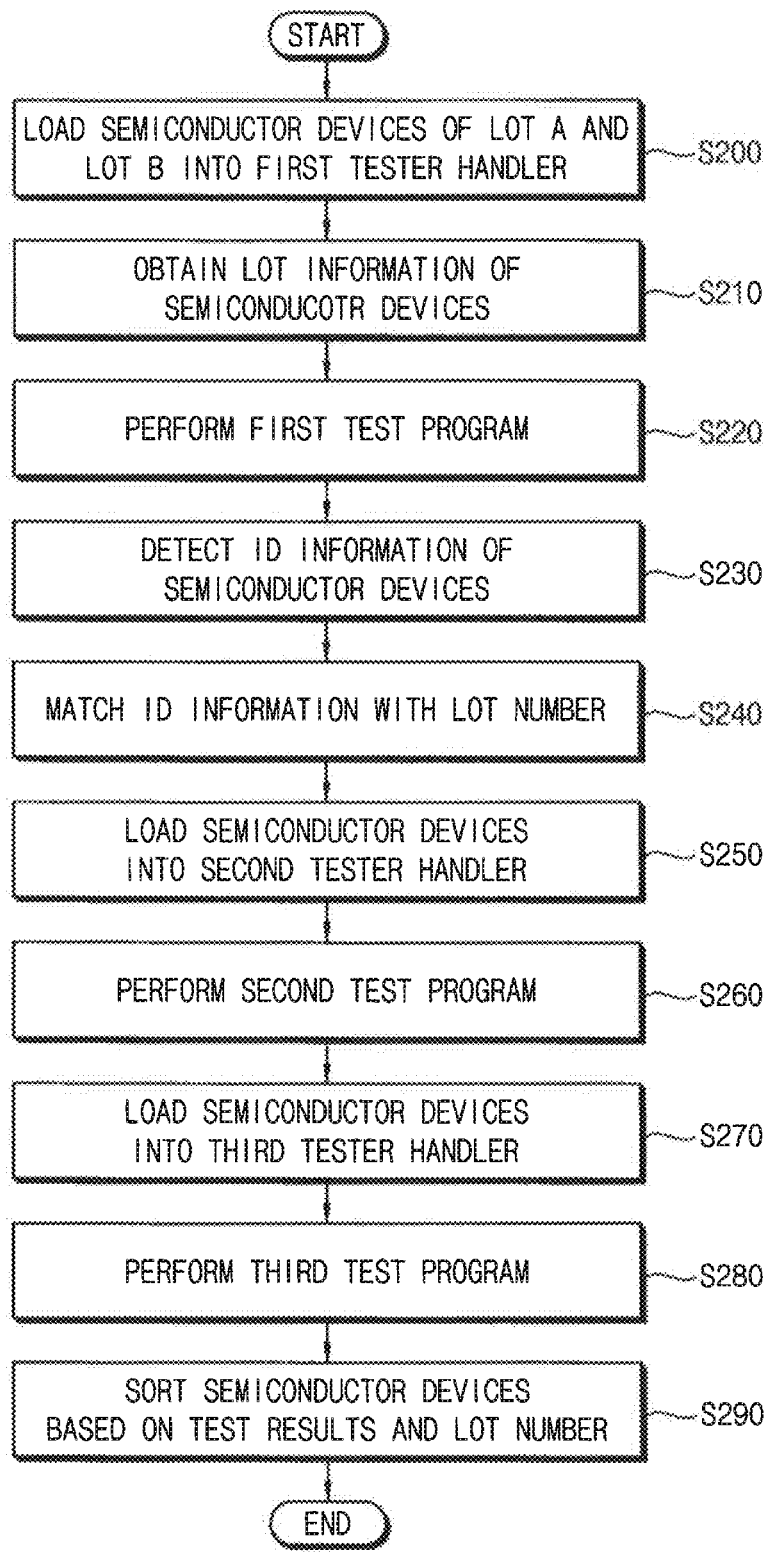
FIG. 6 is a flow chart illustrating a test method for a semiconductor device in accordance with exemplary embodiments of the inventive concept.

FIG. 6 is a flow chart illustrating a test method for a semiconductor device in accordance with exemplary embodiments of the inventive concept.

Referring to FIGS. 5 and 6, semiconductor devices of different lots (lot A, lot B) may be loaded on a test tray of the first tester handler 100a (S200). In this case, the first test program (P1) may be performed on the semiconductor devices of the different lots (lot A, lot B).

For example, a first portion of the semiconductor devices of the lot A may be loaded sequentially onto first test trays to perform the first test program (P1). A second portion of the semiconductor devices of the lot A and a first portion of the semiconductor devices of the lot B may be loaded onto a second test tray to perform the first test program (P1).

In exemplary embodiments of the inventive concept, when the semiconductor devices of the lot A and the lot B are loaded into the first tester handler 100a, lot information, for example, a lot number (lot A, lot B) of the loaded semiconductor devices may be obtained and stored (S210).

An operator may input the lot information of the semiconductor devices by using a control console of the first tester 200a. The first tester 200a may transmit the lot information to the tester server 300, and the tester server 300 may store the lot information of each of the semiconductor devices.

Then, the first test program (P1) may be performed on the semiconductor devices (S220). Here, ID information of the semiconductor devices may be detected (S230).

The tester server 300 may transmit the first test program (P1) corresponding to the transmitted lot information to the first tester 200a, and the first tester 200a may perform the first test program (P1) on the semiconductor devices of the lot A and the lot B. Here, the first tester 200a may detect the ID information of the semiconductor devices when performing the first test program (P1).

Then, the ID information and the lot information of the semiconductor devices may be matched with each other (S240).

After the test of the first test program (P1) is completed, the first tester 200a may transmit first test results and the ID information of the semiconductor devices of the lot A and the lot B to the tester server 300. The tester server 300 may receive the lot information and the ID information of the semiconductor devices and store them in a database. The tester server 300 may match the ID information with the lot information. The semiconductor devices on which the first test program (P1) is performed may be mapped to the respective lot numbers (lot A, lot B). For example, the first test results of a first one of the semiconductor devices having a unique ID may be stored together with the lot number of the first semiconductor device in the tester server 300. Accordingly; historical test data of the first semiconductor device may include the first test result information and its own lot information.

The semiconductor devices on which the first test program (P1) is performed may be unloaded from the first tester handler 100a, and then, loaded on a test tray of a second tester handler 100b (S250). Then, a second test program (P2) may be performed on the semiconductor devices of different lots (lot A, lot B) (S260). Here, the ID information of the semiconductor devices may be detected.

The tester server 300 may transmit the second test program (P2) to a second tester 200b, and the second tester 200b may perform the second test program (P2) on the semiconductor devices of the lot A and the lot B. Here, the second tester 200b may detect the ID information of the semiconductor devices when performing the second test program (P2).

After the test of the second test program (P2) is completed, the second tester 200b may transmit second test results and the ID information of the semiconductor devices to the tester server 300. The tester server 300 may receive the ID information of the semiconductor devices and store them in a database. The tester server 300 may match the ID information with the lot information. The semiconductor devices on which the second test program (P2) is performed may be mapped to the respective lot numbers (lot A, lot B). For example, the second test results of the semiconductor device having the unique ID may be stored together with its own lot number in the tester server 300. Accordingly, the historical test data of the first semiconductor device may include the first and second test result information and its own lot information.

The semiconductor devices on which the second test program (P2) is performed may be unloaded from the second tester handler 100b, and then, loaded on a test tray of a third tester handler 100c (S270). Then, a third test program (P3) may be performed on the semiconductor devices of different lots (lot A, lot B) (S280). Here, the ID information of the semiconductor devices may be detected.

The tester server 300 may transmit the third test program (P3) to a third tester 200c, and the third tester 200c may perform the third test program (P3) on the semiconductor devices of the lot A and the lot B. Here, the third tester 200c may detect the ID information of the semiconductor devices when performing the third test program (P3).

After the test of the third test program (P3) is completed, the third tester 200c may transmit third test results and the ID information of the semiconductor devices to the tester server 300. The tester server 300 may receive the ID information of the semiconductor devices and store them in a database. The tester server 300 may match the ID information with the lot information. The semiconductor devices on which the third test program (P3) is performed may be mapped to the respective lot numbers (lot A, lot B). For example, the third test results of the first semiconductor device having the unique ID may be stored together with its own lot number in the tester server 300. Accordingly, the historical test data of the first semiconductor device may include the first, second and third test result information and its own lot information.

Then, the semiconductor devices may be sorted based on the first, second and third test results and the lot information (S290).

The tester server 300 may transmit the sorting information of the each of the semiconductor devices of the lot A and the lot B to the third tester 200c, and accordingly, the third tester handler 100c may sort the semiconductor devices according to the first, second and third test results and the lot sorting information and move and stack the semiconductor devices to customer trays.

For example, the semiconductor devices which are determined to be non-defective according to the first, second and third test results (test grade information) and have the lot number of the lot A (lot sorting information) may be moved and stacked on a third customer tray of a first unloading stacker of an unloading part of the third tester handler 100c. The semiconductor devices which are determined to be non-defective according to the first, second and third test results (test grade information) and have the lot number of the lot B (lot sorting information) may be moved and stacked on a fourth customer tray of a second unloading stacker of the unloading part. The semiconductor devices which are determined to be defective according to the first, second and third test results (test grade information) and have the lot number of the lot A or the lot B (lot sorting information) may be moved and stacked on a fifth customer tray of a third unloading stacker of the unloading part.

The above-mentioned test system and the test method may be used to manufacture semiconductor devices including logic devices and memory devices. For example, the manufactured semiconductor device may be applied to logic devices such as central processing units (CPUs), main processing units (MPUs), or application processors (APs), or the like, as well as volatile memory devices such as DRAM devices, static RAM (SRAM) devices, or non-volatile memory devices such as flash memory devices, phase change RAM (PRAM) devices, magnetic RAM (MRAM) devices, resistive RAM (ReRAM) devices, or the like.

While the inventive concept has been described with reference to exemplary embodiments thereof, those skilled in the art will readily appreciate that many modifications are possible without departing from the scope of the inventive concept as defined by the following claims.

What is claimed is:

1. A test method for a semiconductor device, comprising:
   loading a test tray having semiconductor devices of first and second lots arranged thereon into a test chamber;
   storing lot information of each of the semiconductor devices;

performing a test program on each of the semiconductor devices of each of the first and second lots, wherein the first and second lots are tested together;

obtaining ID information of each of the semiconductor devices;

matching the ID information with the lot information to generate lot sorting information; and sorting the semiconductor devices based on results of the test program and the lot sorting information.

2. The test method for a semiconductor device of claim 1, wherein loading the test tray into the test chamber comprises:

providing a tester handler with a first customer tray having the semiconductor devices of the first lot arranged thereon;

providing the tester handler with a second customer tray having the semiconductor devices of the second lot arranged thereon; and moving the semiconductor devices on the first and second customer trays to the test tray.

3. The test method for a semiconductor device of claim 2, wherein the first customer tray is moved to a first loading stacker of the tester handler, and the second customer tray is moved to a second loading stacker of the tester handler.

4. The test method for a semiconductor device of claim 2, wherein sorting the semiconductor devices based on results of the test program and the lot sorting information comprises:

moving the semiconductor devices which are determined to be non-defective according to the results of the test program and have the lot information of the first lot to a third customer tray; and moving the semiconductor devices which are determined to be non-defective according to the results of the test program and have the lot information of the second lot to a fourth customer tray.

5. The test method for a semiconductor device of claim 4, wherein sorting the semiconductor devices based on results of the test program and the lot sorting information further comprises moving the semiconductor devices which are determined to be defective according to the results of the test program and have the lot information of the first lot or the second lot to a fifth customer tray.

6. The test method for a semiconductor device of claim 1, wherein storing the lot information of each of the semiconductor devices comprises storing a lot number of each of the semiconductor devices in a tester server.

7. The test method for a semiconductor device of claim 6, wherein performing the test program on the semiconductor devices comprises transmitting the test program corresponding to the lot information from the tester server to a tester.

8. The test method for a semiconductor device of claim 1, wherein obtaining the ID information of each of the semiconductor devices comprises:

reading the ID information of each of the semiconductor devices when the test program is performed by a tester; and transmitting the ID information from the tester to a tester server.

9. The test method for a semiconductor device of claim 8, wherein matching the ID information with the lot information comprises:

mapping the ID information of a first semiconductor device to a lot number to which the first semiconductor device belongs; and storing the test results and the lot number as historical test data of the first semiconductor device.

10. The test method for a semiconductor device of claim 1, wherein sorting the semiconductor devices based on results of the test program and the lot sorting information comprises moving the semiconductor devices to customer trays which are separated according to respective lot numbers to which the semiconductor devices belong.

11. A test method for a semiconductor device, comprising:

sequentially loading a test tray having semiconductor devices of first and second lots arranged thereon into first and second tester handlers which perform different test programs;

storing lot information of each of the semiconductor devices when the semiconductor devices are loaded into the first and second tester handlers;

sequentially performing the test programs on the semiconductor devices in the first tester handler, and then, sequentially performing the test programs on the semiconductor devices in the second tester handler;

matching the ID information with the lot information of each of the semiconductor devices when each of the test programs is performed, to generate lot sorting information; and after performing a final test program, sorting the semiconductor devices based on test results and the lot sorting information.

12. The test method for a semiconductor device of claim 11, wherein loading the test tray into the first tester handler comprises:

providing the first tester handler with a first customer tray having the semiconductor devices of the first lot arranged thereon;

providing the first tester handler with a second customer tray having the semiconductor devices of the second lot arranged thereon; and moving the semiconductor devices on the first and second trays to one test tray of the first tester handler.

13. The test method for a semiconductor device of claim 12, wherein sorting the semiconductor devices based on the test results and the lot sorting information comprises:

moving the semiconductor devices which are determined to be non-defective according to the test results and have the lot information of the first lot to a third customer tray; and moving the semiconductor devices which are determined to be non-defective according to the test results and have the lot information of the second lot to a fourth customer tray.

14. The test method for a semiconductor device of claim 13, wherein sorting the semiconductor devices based on the test results and the lot sorting information further comprises moving the semiconductor devices which are determined to be defective according to the test results and have the lot information of the first lot or the second lot to a fifth customer tray.

15. The test method for a semiconductor device of claim 11, wherein matching the ID information with the lot information of each of the semiconductor devices comprises:

reading the ID information of each of the semiconductor devices when the test program is performed by a tester; and mapping the ID information of each of the semiconductor devices to a lot number to which the semiconductor device belongs.

16. A test system for a semiconductor device, comprising:

a tester configured to test semiconductor devices;

a tester server connected to the tester, and configured to provide a test program to the tester and configured to match ID information with lot information of each of the semiconductor devices to generate lot sorting information when the test program is performed; and a tester handler connected to the tester, and configured to load and unload the semiconductor devices into and from a test chamber to electrically test the semiconductor devices and configured to sort the semiconductor devices based on test results and the lot sorting information, wherein a test tray having the semiconductor devices of first and second lots arranged thereon is loaded into the tester handler, and the tester performs the test program on the semiconductor devices of the first and second lots on the test tray at the same time.

17. The test system for a semiconductor device of claim 16, wherein the tester handler moves the semiconductor devices which are determined to be non-defective according to the test results and have the lot information of the first lot to a first tray, and the tester handler moves the semiconductor devices which are determined to be non-defective according to the test results and have the lot information of the second lot to a second tray.

18. The test system for a semiconductor device of claim 17, wherein the tester handler moves the semiconductor devices which are determined to be defective according to the test results and have the lot information of the first lot or the second lot to a third tray.

19. The test system for a semiconductor device of claim 16, wherein the tester reads ID information of each of the semiconductor devices when performing the test program, and the tester server maps the ID information of each of the semiconductor devices to a lot number to which the semiconductor device belongs, to generate the lot sorting information.

* * * * *